United States Patent [19]
Kim

[11] Patent Number: 5,890,194
[45] Date of Patent: Mar. 30, 1999

[54] METHOD FOR EFFICIENT USE OF DRAM DATA AND PARITY AREAS

[75] Inventor: Jeen Gee Kim, Seoul, Rep. of Korea

[73] Assignee: Hyundai Electronics Industries Co., Ltd., Rep. of Korea

[21] Appl. No.: 611,173

[22] Filed: Mar. 5, 1996

[30] Foreign Application Priority Data

Mar. 7, 1995 [KR] Rep. of Korea .................... 1995 4577

[51] Int. Cl.[6] ...................................................... G06F 12/00
[52] U.S. Cl. ............................................ 711/105; 711/209
[58] Field of Search ........................... 711/105; 395/500, 395/419

[56] References Cited

U.S. PATENT DOCUMENTS

| | | | |
|---|---|---|---|
| 5,270,964 | 12/1993 | Bechtolsheim et al. | 365/52 |
| 5,357,624 | 10/1994 | Lavan | 711/115 |
| 5,383,148 | 1/1995 | Testa et al. | 365/52 |
| 5,394,538 | 2/1995 | Wada et al. | 711/171 |
| 5,611,064 | 3/1997 | Maund et al. | 395/419 |
| 5,613,094 | 3/1997 | Khan et al. | 395/500 |

*Primary Examiner*—Tod R. Swann
*Assistant Examiner*—David Langjahr
*Attorney, Agent, or Firm*—Fish & Richardson P.C.

[57] ABSTRACT

A method for connecting a DRAM module to memory portions of a main processor and memory management PCB board assembly (MPMA PBA) included in a main processor hardware (MPH) block and adapted to perform a higher-order control in a full electronic exchange. In accordance with this method, the DRAM, which is of the zigzag-in-line package type, is replaced by that of the module type so that its parity DRAM area is integrated with memory areas included in the DRAM, thereby enabling waste memory portions of the parity DRAM area to be efficiently managed. A common RAS control signal is divided into a plurality of signals respectively adapted to be used as control signals for defining respective memory areas of the DRAM along with other control signals, namely, CAS and WE control signals. A basic address for the DRAM is determined to obtain an easy memory expansion.

11 Claims, 23 Drawing Sheets

| FIG. 4A | FIG. 4B |

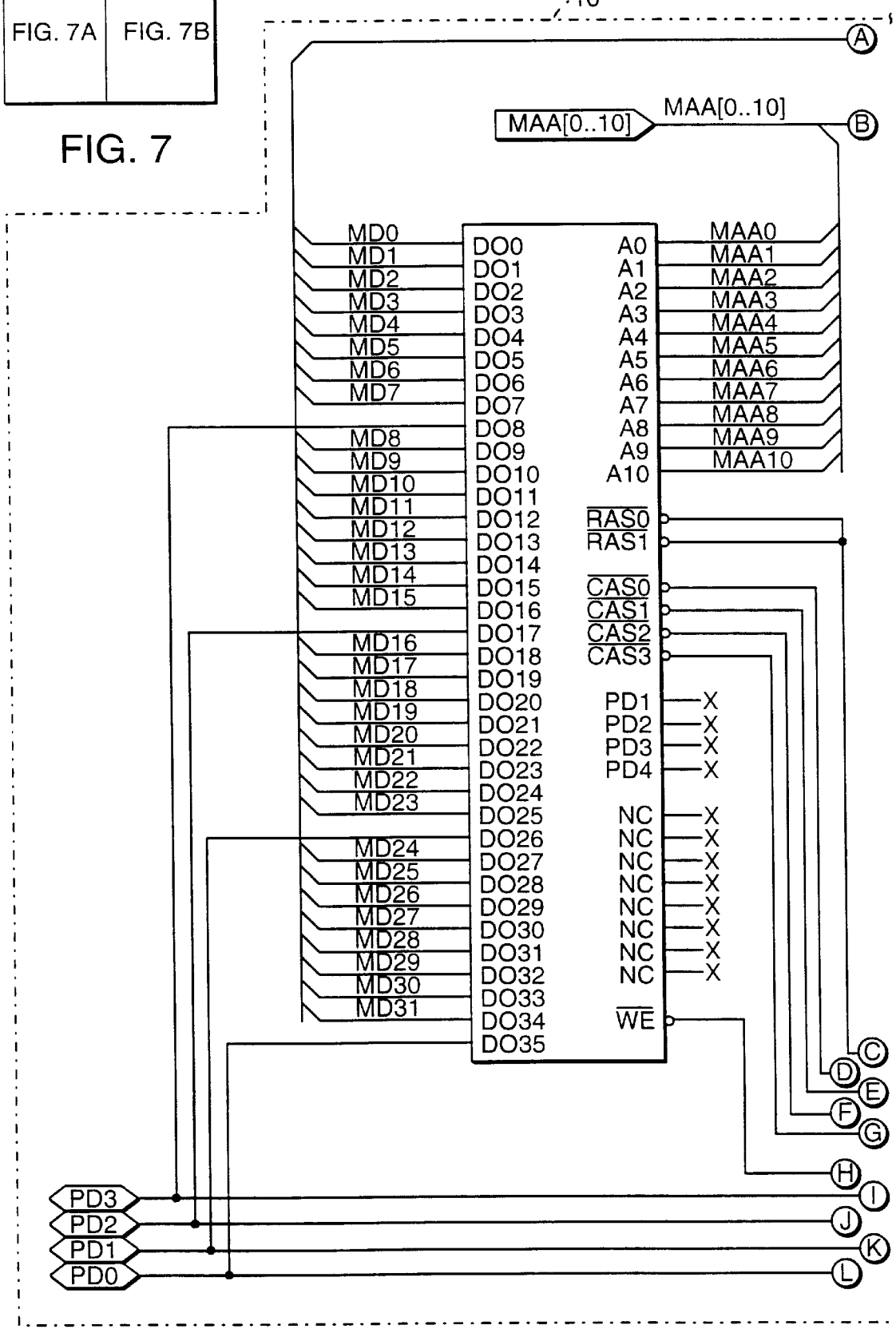

METHOD FOR EFFICIENT USE OF DRAM DATA AND PARITY AREAS

BACKGROUND OF THE INVENTION

1. Field of the Invention

The present invention relates to a method for connecting a DRAM module to a DRAM included in a higher-order control system of a full electronic exchange, and more particularly to a method for connecting a DRAM module to memory portions of a main processor and memory management PCB board assembly (MPMA PBA) included in a main processor hardware (MPH) block and adapted to perform a higher-order control in a full electronic exchange.

2. Description of the Prior Art

Generally, DRAM's used in higher-order control systems of full electronic exchanges have a troublesomeness in expanding their memory capacity because they are fixed to 16 M bytes. This will be described in detail in conjunction with FIG. 1 which shows the relationship between a DRAM included in an MPMA and a central processing unit serving to define memory areas of the DRAM. As shown in FIG. 1, the MPMA includes the central processing unit, which is denoted by the reference numeral 1. The central processing unit 1 serves to control various units of the MPMA. The MPMA further includes an address bus 2 for transmitting address data output from the central processing unit 1 to desired units of the MPMA, and a data bus 3 for transmitting real data output from the central processing unit 1 to desired units of the MPMA. A control signal generating unit 4 is also provided which serves to receive a control signal from the central processing unit 1, thereby outputting control signals selecting respective memory areas of DRAM's 5 and 6 which are also included in the MPMA. The DRAM 5 is stored with practical programs required for the system whereas the DRAM 6 is a 16-bit parity DRAM. To the MPMA, a dependent MPMA is connected, which has the same arrangement as the MPMA. Thus, a double MPMA arrangement is obtained.

The double MPMA arrangement obtained by the dependant MPMA means that it can carry out either a main operation or dependent operation in accordance with the situation. In this arrangement, the main MPMA has a circuit arrangement enabling both reading and writing.

Each DRAM used in the MPMA having the above-mentioned arrangement is a zigzag-in-line package type RAM. This RAM has a total memory area of 4 M×36 bits including a data area of 4 m×32 bits and a parity area of 4 M×4 bits.

The control signal output from the central processing unit 1 is applied to the control signal generating unit 4 which, in turn, converts the signal into control signals for respectively selecting memory areas of the DRAM's 5 and 6.

The inner memory area of the data DRAM 5 is divided into a plurality of sub-areas each having a memory capacity of 4 bytes. Hereinafter, such a sub-area will be referred to as "a bank". The data DRAM 5 includes four banks.

These banks are selected in accordance with associated control signals output from the control signal generating unit 4, respectively. These control signals for selecting the banks of the data DRAM 5 are signals CAS0, CAS1, CAS2 and CAS3, respectively.

All banks of the data DRAM 5 are commonly coupled to a control signal RAS output from the control signal generating unit 4. This RAS signal is used in combination with each CAS signal. Each unit bank is constructed to carry out its 8-, 16- and 32-bit data transmitting operations in accordance with respective signals, WE0, WE1, WE2 and WE3, for writing operations along with an OE signal for reading operations. The reason why each unit bank enables such data transmitting operations is because the zigzag-in-line package type DRAM has a structure including RAS, CAS, WE and OE. All the above-mentioned signals are adapted to operate in a low level (designated "active low" or "/").

The parity DRAM 6 has a memory area having a 16 M-bit size and operates a control signal CASP. This parity DRAM 6 is stored with parity data corresponding to each 8-bit data stored in the data DRAM 5. When data is written on the data DRAM 5, parity data associated with the data being written on the data DRAM 5 is also written on the parity DRAM 6. When the data stored in the data DRAM 5 is read, the data stored in the parity DRAM 6 is also read to determine whether the data read out of the data DRAM 5 is normal or has errors.

In terms of the memory area, the data DRAM 5 and parity DRAM 6 have the relationship that the parity DRAM 6 always requires its entire memory area, namely, a 16 M-bit memory area irrespective of whether the memory area of the data DRAM 5 being used is a 4 M- or 16 M-byte bank.

However, this is a considerable economical loss. Even though the memory capacity of the data DRAM 5 increases using the same circuit as the memory thereof, the parity DRAM 6 still involve the waste of its memory.

Meanwhile, many of full electronic exchanges being presently used require DRAM's for MPMA PBA which have a memory size of larger than 16 M bytes. Furthermore, this requirement is on an increasing trend. For higher-order control systems requiring a memory size of larger than 16 M bytes, a PBA, which is a separate board called "MECA", is used in addition to the data DRAM 5 because the data DRAM 5, which has a divided construction, is fixed to 16 M bytes. This PBA serves to expand the memory size from the 16 M-byte size.

Taking into consideration the double MPMA arrangement, two PBA boards which have the same size as the MPMA PBA are required. In accordance with this method, however, the MPMA PBA can not expand its memory size by itself.

SUMMARY OF THE INVENTION

Therefore, an object of the invention is to solve the above-mentioned problems involved in the prior art and to provide a memory expanding method capable of expanding the memory size only by modifying connected addresses in accordance with a DRAM module connecting technique.

In accordance with the present invention, this object is accomplished by providing a method for connecting a DRAM module to a DRAM included in a higher-order control system of a full electronic exchange, wherein the DRAM, which is of the zigzag-in-line package type, is replaced by that of the module type so that its parity DRAM area is integrated with memory areas included in the DRAM, thereby enabling waste memory portions of the parity DRAM area to be efficiently managed, wherein a common RAS control signal is divided into a plurality of signals respectively adapted to be used as control signals for defining respective memory areas of the DRAM along with other control signals, namely, CAS and WE control signals, and wherein a basic address for the DRAM is determined to obtain an easy memory expansion.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
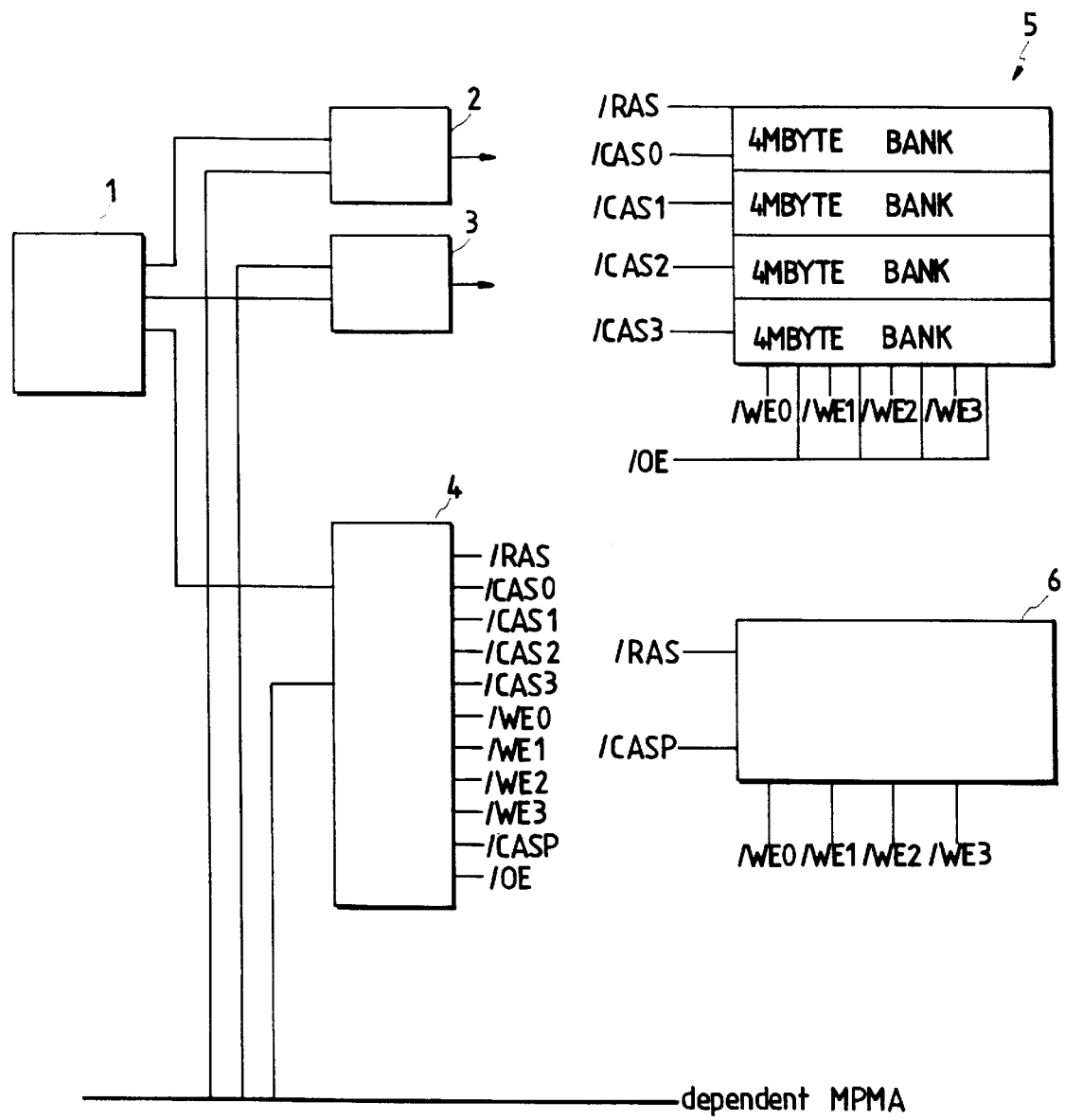
FIG. 1 is a block diagram showing the relationship between a DRAM included in an MPMA and a central processing unit serving to define memory areas of the DRAM.
Figure 2:
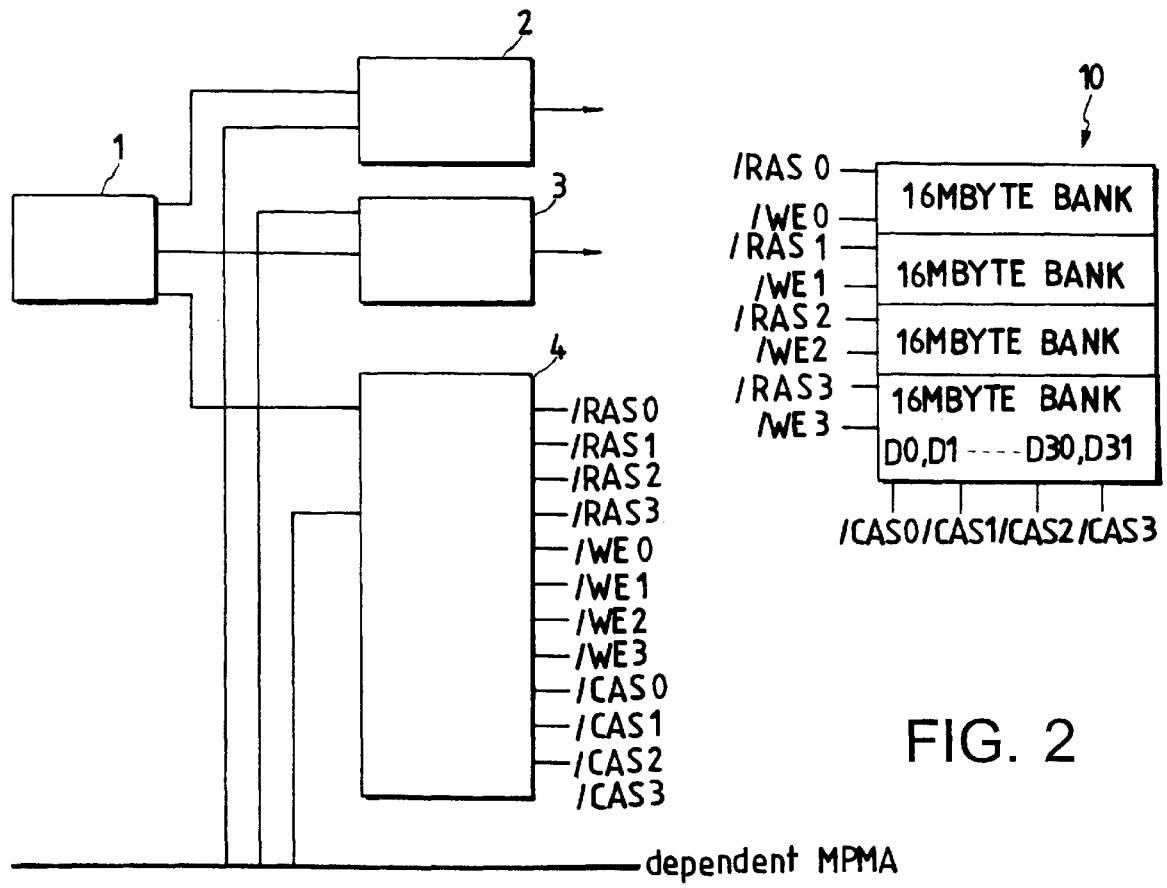
FIG. 2 is a block diagram of an MPMA according to the present invention, which shows the relationship between a DRAM included in the MPMA and a central processing unit serving to define memory areas of the DRAM.

FIG. 2 is a block diagram of an MPMA according to the present invention, which shows the relationship between a DRAM included in the MPMA and a central processing unit serving to define memory areas of the DRAM. In FIG. 2, elements respectively corresponding to those in FIG. 1 are denoted by the same reference numerals.

As shown in FIG. 2, the MPMA includes the central processing unit, which is denoted by the reference numeral 1. The central processing unit 1 serves to control various units of the MPMA. The MPMA further includes an address bus 2 for transmitting address data output from the central processing unit 1 to desired units of the MPMA, and a data bus 3 for transmitting real data output from the central processing unit 1 to desired units of the MPMA. A control signal generating unit 4 is also provided which serves to receive a control signal from the central processing unit 1, thereby outputting control signals RAS, CAS and WE selecting respective memory areas of a DRAM 10 which is also included in the MPMA. The DRAM 10 is stored with practical programs and parity data required for the system. To the MPMA, a dependent MPMA is connected, which has the same arrangement as the MPMA. Thus, a double MPMA arrangement is obtained.

In the MPMA PBA having the above-mentioned arrangement, the control signal generating unit 4 receives a control signal output from the central processing unit 1, thereby outputting control signals for defining and enabling respective memory areas of the DRAM 10 including data RAM areas and areas on which parity data will be written. The module type of the DRAM used in accordance with the present invention includes RAS, CAS and WE. The control signals for selecting respective memory areas of the DRAM 10 include RAS signals, namely, signals RAS0, RAS1, RAS2 and RAS3.

These RAS signals are combined with associated WE signals to define respective data memory areas of the DRAM. This will be described in detail, hereinafter.

The RAS and WE signals have a basic address of A23.

When either an input signal A24 or A25 has a low level, the basic 16 M-byte bank of the DRAM 10 is used;

When the input signal A24 has a low level whereas the input signal A25 has a high level, a next 16 M-byte bank of the DRAM 10 is used;

When the input signal A24 has a high level whereas the input signal A25 has a low level, a next 16 M-byte bank of the DRAM 10 is used; and When both the input signals A24 and A25 have a high level, the remaining 16 M-byte bank of the DRAM 10 is used.

Where the above procedure is carried out for 4 M-byte banks, an input signal A21 is used as a basic address. In this case, input signals A22 and A23 are adapted to drive the remaining banks, respectively. Where the above procedure is carried out for 64 M-byte banks, an input signal A25 is used as a basic address. In this case, input signals A26 and A27 are adapted to drive the remaining banks, respectively.

Thus, the above procedure can be carried out in an appropriate manner in accordance with the size of a memory to be used.

The CAS signals output from the control signal generating unit 4, namely, control signals CAS0, CAS1, CAS2 and CAS3 designate required memory areas, such as "BYTE" (2 bytes), "WORD" (2 bytes) or "LONG WORD" (4 bytes), in association with the RAS signals and WE signals when required banks are selected, thereby enabling a required operation such as writing or reading.

Figure 3:
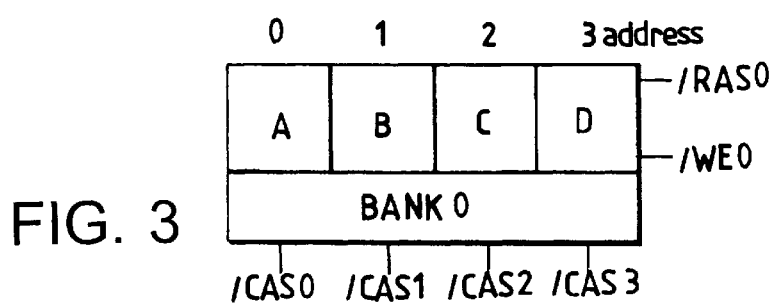
FIG. 3 is a diagram illustrating one bank of the DRAM shown in FIG. 2 along with control signals required upon selecting effective data for the bank.

Now, the operation for designating memory areas by use of the above-mentioned signals will be described in conjunction with the operation for the 4-byte LONG WORD allocated with 0th to third addresses. As shown in FIG. 3, operations of all the memory areas A, B, C and D are associated with control signals CAS0, CAS1, CAS2 and CAS3, respectively, along with control signals RAS0 and WE0. For example, where a certain value is to be written on the memory area B, a signal processing is carried out such that the control signals RAS0, WE0 and CAS1 are coincident together. For other memory areas, the same method as mentioned above is used to select those memory areas.

For reference, Motolora type central processing units have a data bus structure opposite to that of Intel type central processing units. Accordingly, in such Motolora type central processing units, data is written in the order of D31 to D24 for the operation for BYTE and in the order of D31 to D16 for the operation for WORD. In other words, the Motolora type central processing units write effective data in the order opposite to that of the Intel type central processing units.

The parity DRAM, which is separately used in conventional cases, is integrated in the memory areas occupied by the DRAM 10 itself in accordance with the present invention. Accordingly, the present invention eliminates waste memories involved in the conventional cases.

Now, circuits of memory modules modified in accordance with the present invention will be described in conjunction with FIGS. 4 to 7. In FIGS. 4 to 7, only essential constituting elements of the illustrated chips are denoted by reference numerals, respectively.

Figures 4, 4A:
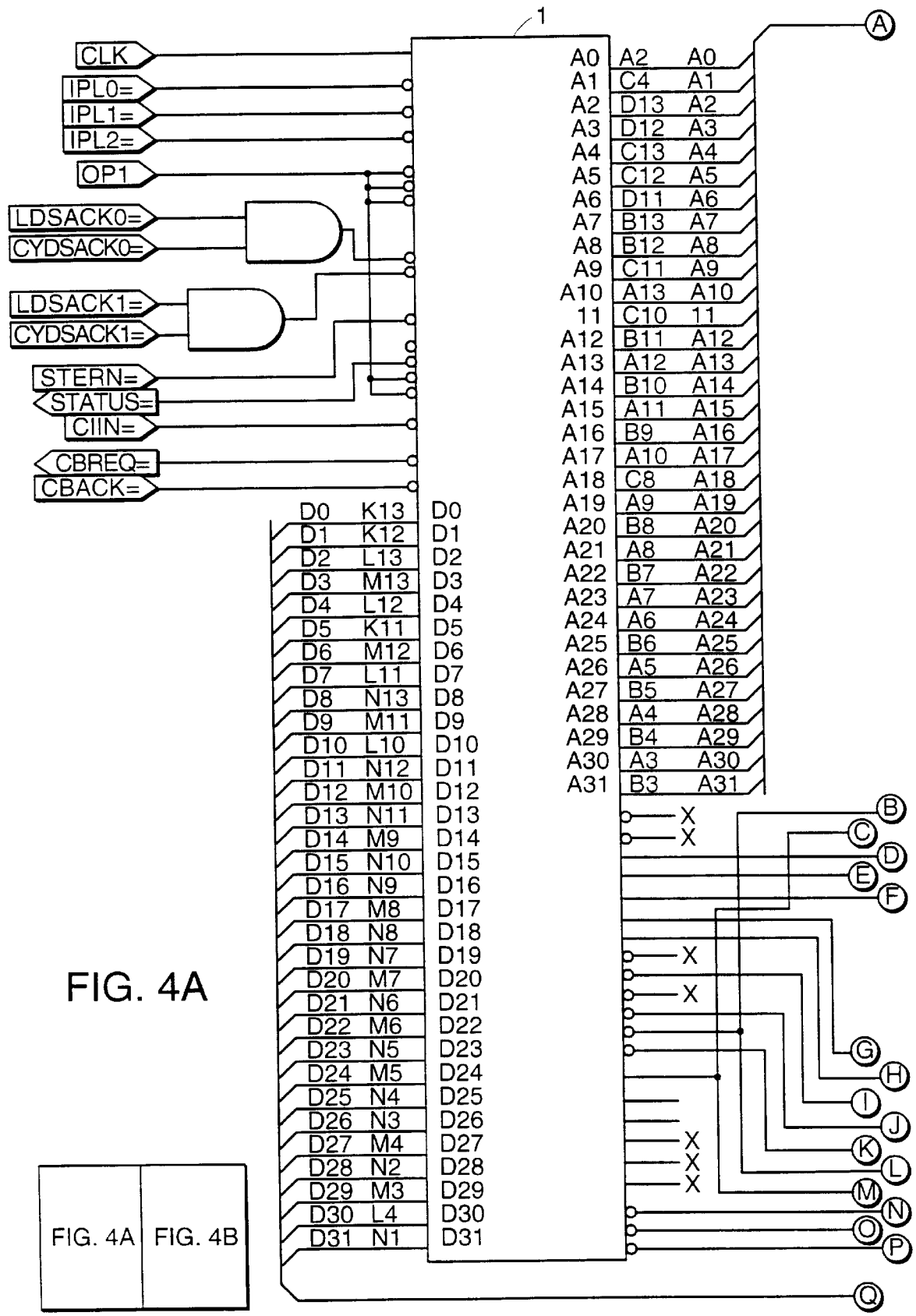
FIG. 4 (made up of views shown in FIGS. 4A and 4B) is a circuit diagram illustrating the central processing unit and address buffer according to the present invention.
Figure 4B:
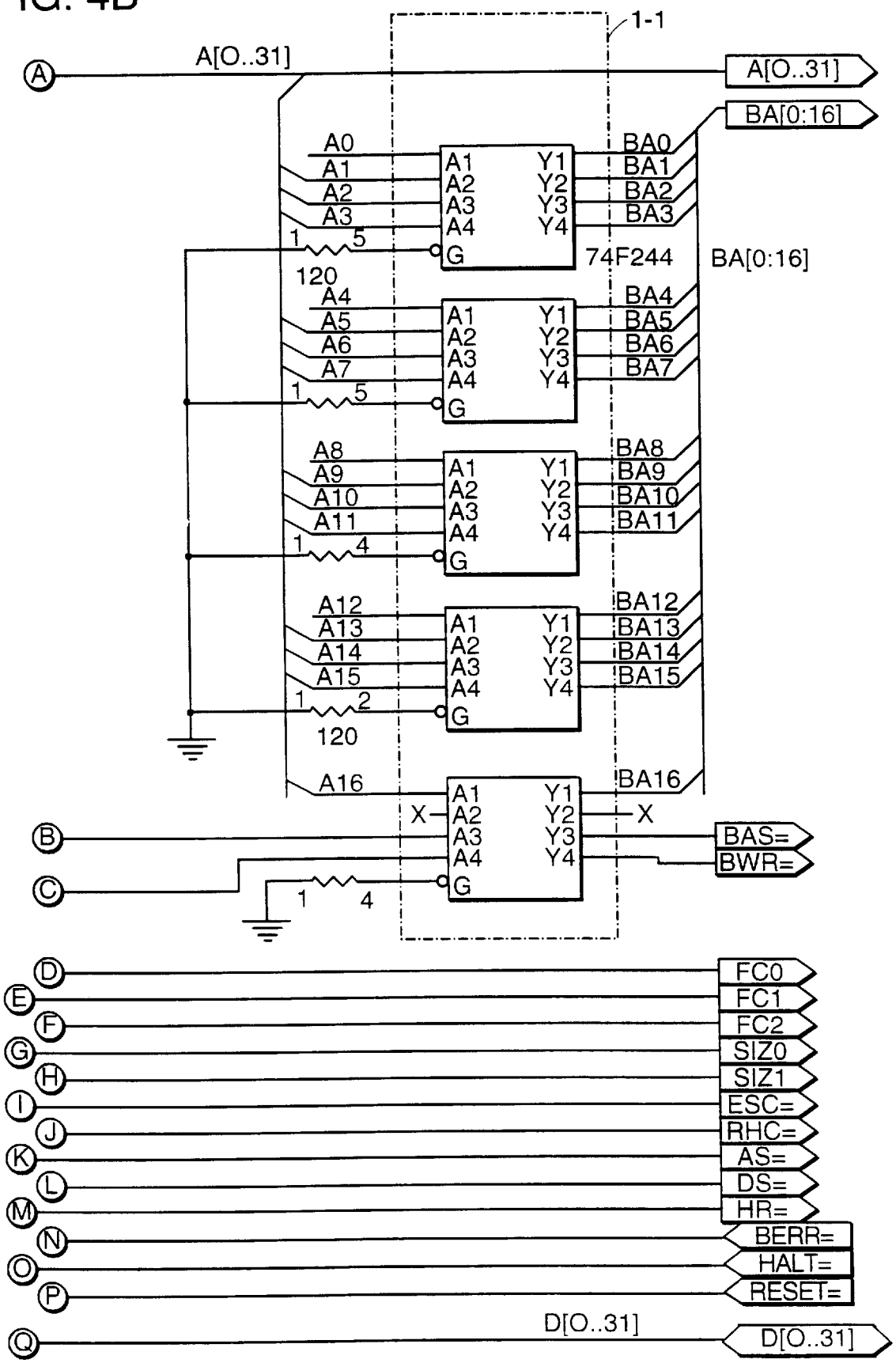

FIG. 4 is a circuit diagram illustrating the central processing unit and address buffer according to the present invention. This circuit includes the central processing unit 1 for controlling various units of the system and an address buffer 1-1 for receiving address data output from the central processing unit 1 and outputting it. The central processing unit 1 used in accordance with the present invention is 680X0.

The central processing unit 1 has output terminals for outputting address data respectively associated with addresses A0 to A31 (A[0 . . . 31]). These output terminals of the central processing unit 1 are partially coupled to the DRAM or control signal generating unit via the address buffer 1-1. The remaining output terminals of the central processing unit 1 are coupled to other units (not shown).

The central processing unit 1 is also connected to data lines D0 to D31 (D[0 . . . 31]) in a bi-directional manner so that it can transmit data to various units and receive data from those units.

Figures 5, 5A:
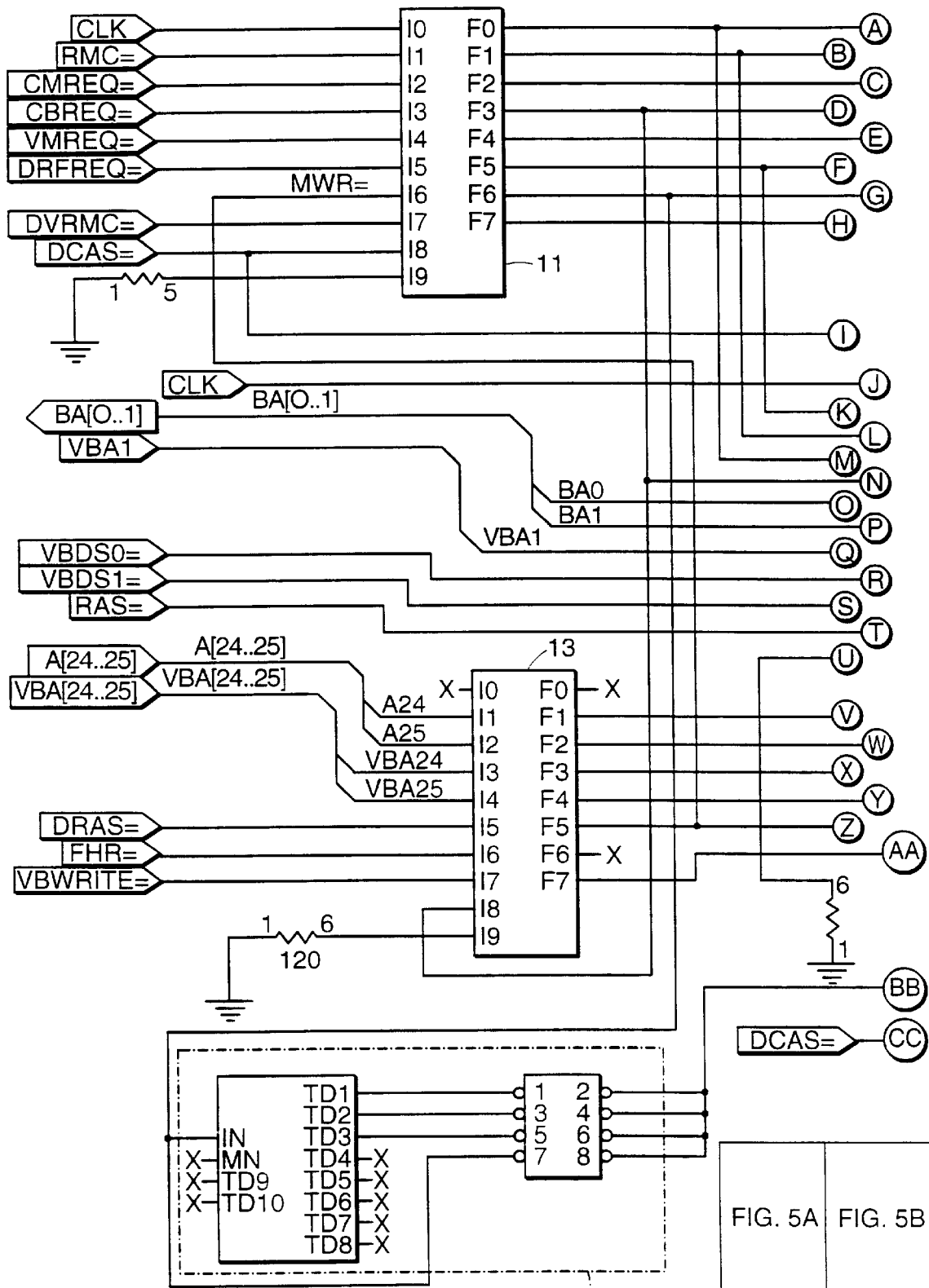
FIG. 5 (made up of views shown in FIGS. 5A and 5B) is a circuit diagram illustrating a circuit for controlling the DRAM and monitoring bus errors in accordance with the present invention.
Figure 5B:
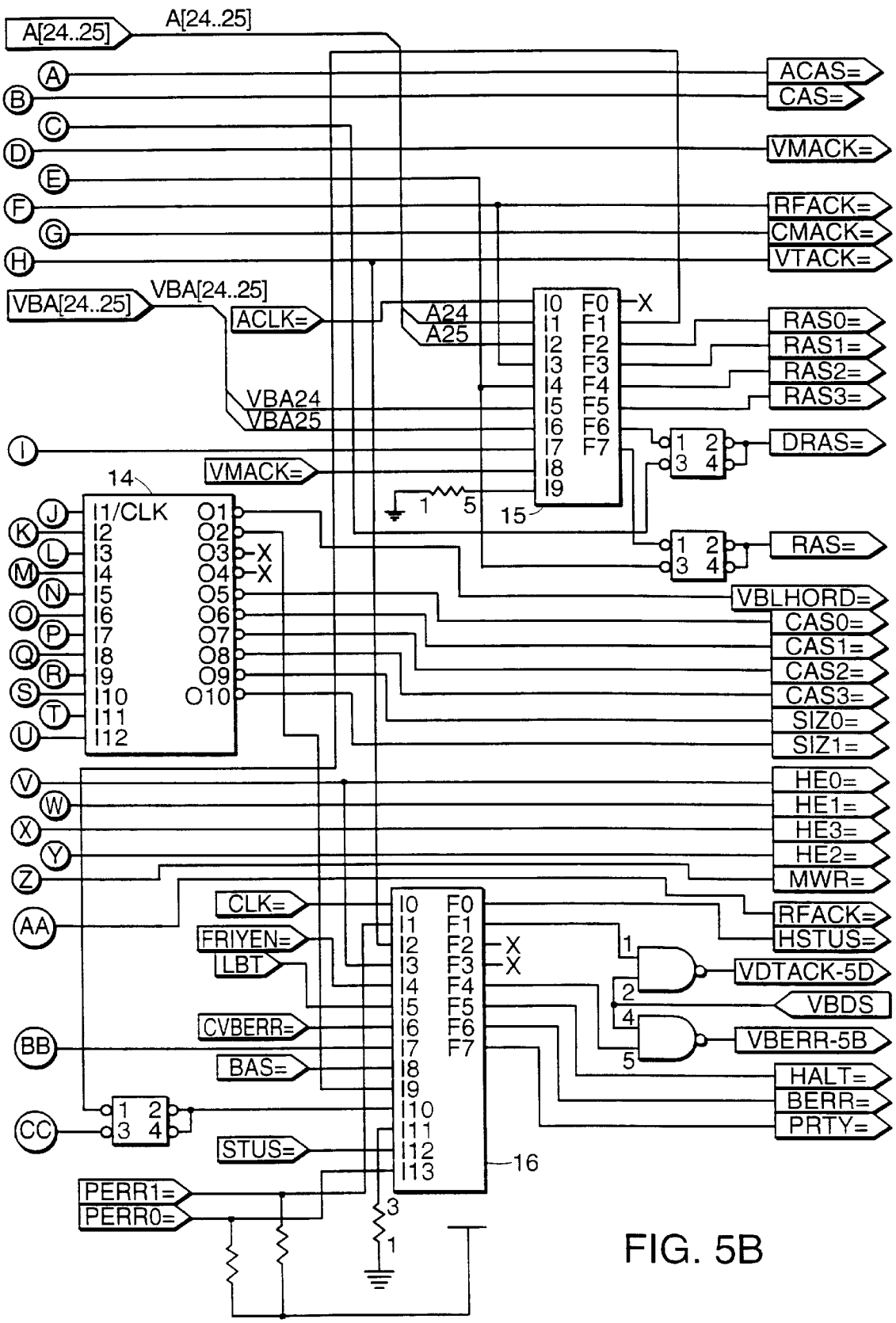

FIG. 5 is a circuit diagram illustrating a circuit for controlling the DRAM 10 and monitoring bus errors. This circuit includes a first IC 11 serving as an interface and a delay unit 12 serving as a delay for signals to be delayed. The circuit also includes a WE signal outputting IC 13 for generating WE signals, which are part of the control signals generated from the control signal generating unit 4, and outputting those WE signals, a CAS signal outputting IC 14 for generating CAS signals, which are part of the control signals generated from the control signal generating unit 4, and outputting those CAS signal, a RAS signal outputting IC 15 for generating RAS signals, which are part of the control signals generated from the control signal generating unit 4, and outputting those RAS signals, and a parity signal outputting IC 16 for outputting parity data for a parity test.

The control signal generating unit 4, which outputs control signals CAS, RAS, WE and PARITY with the above-mentioned arrangement, defines memory areas of the DRAM 10 respectively in accordance with control signals output from the central processing unit 1. The control signal generating unit 4 also outputs, through its each output terminal, a value indicative of the memory size of each corresponding defined memory area to be used.

Figure 6A:
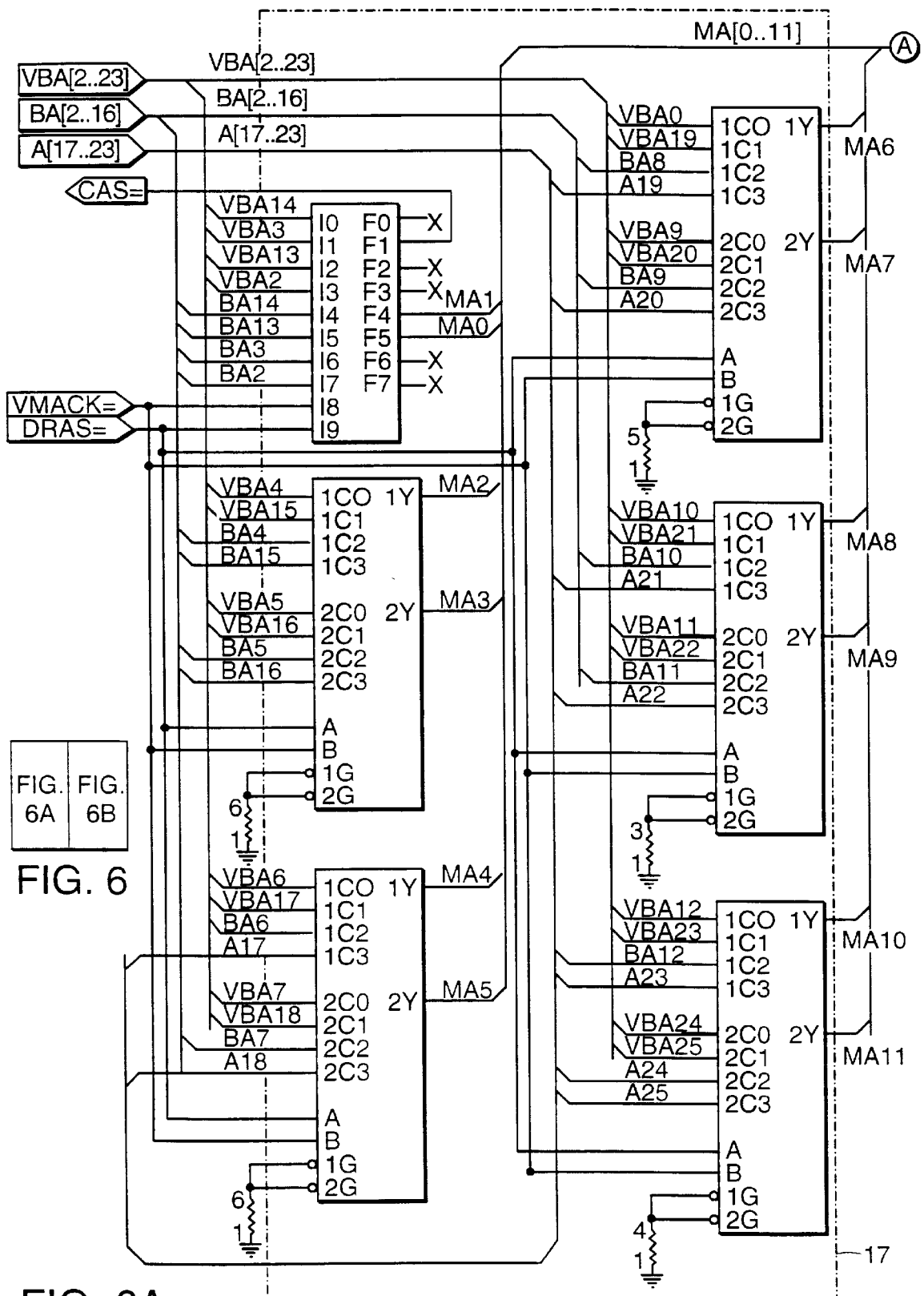
FIG. 6 (made up of views shown in FIGS. 4A and 4B) is a circuit diagram illustrating a circuit for generating RAS and CAS addresses, namely, actual addresses to use memory areas of the DRAM respectively in accordance with the control signals output from control units shown in FIG. 5.
Figure 6B:
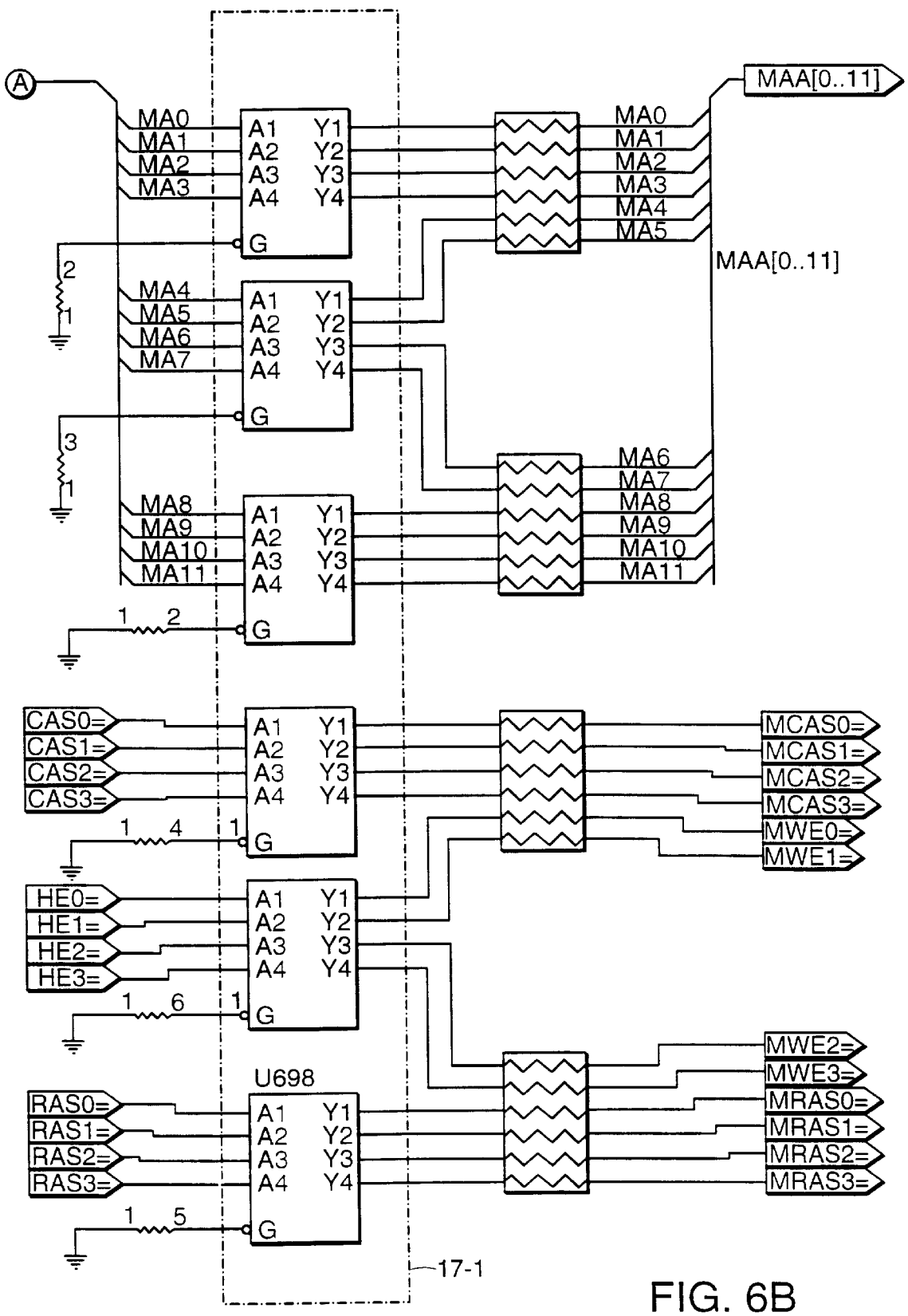

FIG. 6 is a circuit diagram illustrating a circuit for generating RAS and CAS addresses for the DRAM. This circuit is adapted to generate actual addresses to use memory areas of the DRAM 10 respectively in accordance with the control signals output from the control units shown in FIG. 5. The circuit includes a RAS and CAS address generating unit 17 for outputting address signals respectively associated with the RAS and CAS signals, and a buffer unit 17-1 for receiving the address signals output from the RAS and CAS address generating unit 17 and the control signals RAS, CAS and WE from the control signal generating unit 4, and outputting those signals to associated memory areas, respectively. The circuit having such an arrangement receives and transmits data and address signals under the control for its input/output terminals VBA, BA, A, CAS, RAS, WE, MAA, MCAS, MWE and MRAS.

Figure 7B:
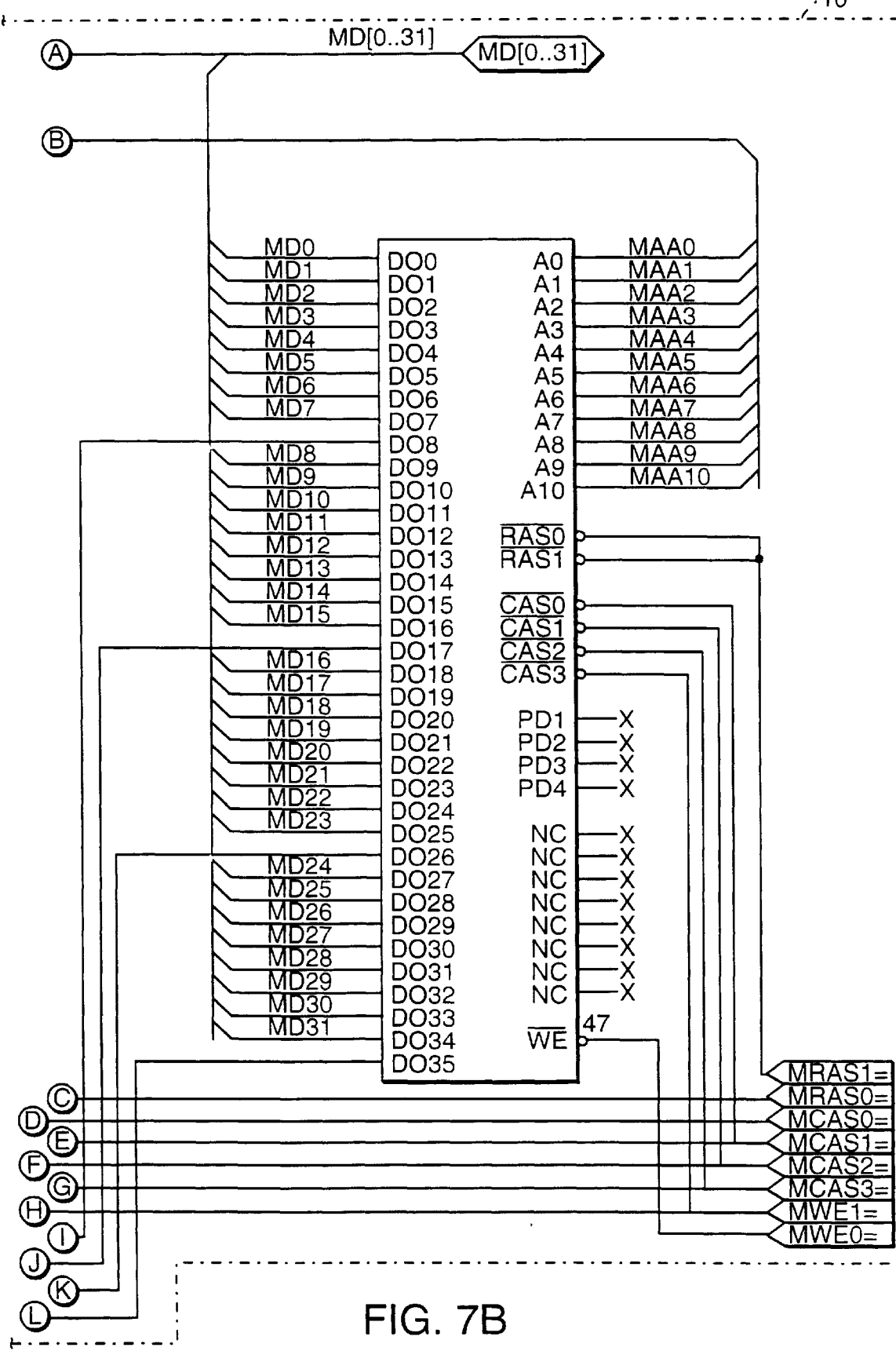
FIG. 7 (made up of views shown in FIGS. 4A and 4B) is a circuit diagram illustrating the DRAM used in accordance with the present invention.

On the other hand, FIG. 7 is a circuit diagram illustrating the DRAM 10 used in accordance with the present invention. The DRAM 10 is coupled to 32 data buses (MD[0 . . . 31]), 11 address buses (Maa[0 . . . 10]), MRAS buses, MCAS buses, MWE buses, and PD buses for transmitting and receiving parity data. Accordingly, this DRAM 10 is operable as the user manipulates the system. Although one DRAM is shown in FIG. 7, four DRAM can be connected to one another in accordance with the control signals CAS0, CAS1, RAS0 and RAS1. For an address expansion, a more number of DRAM's may be used.

The control system, wherein the DRAM 10 is divided into a plurality of memory areas in accordance with the present invention, will now be described in conjunction with timing diagrams respectively shown in FIGS. 8 to 20. The timing diagrams are based on signals measured at an operating frequency of 31.9488 MHz which is the same as that used in the central processing unit of the present invention.

Figure 8:
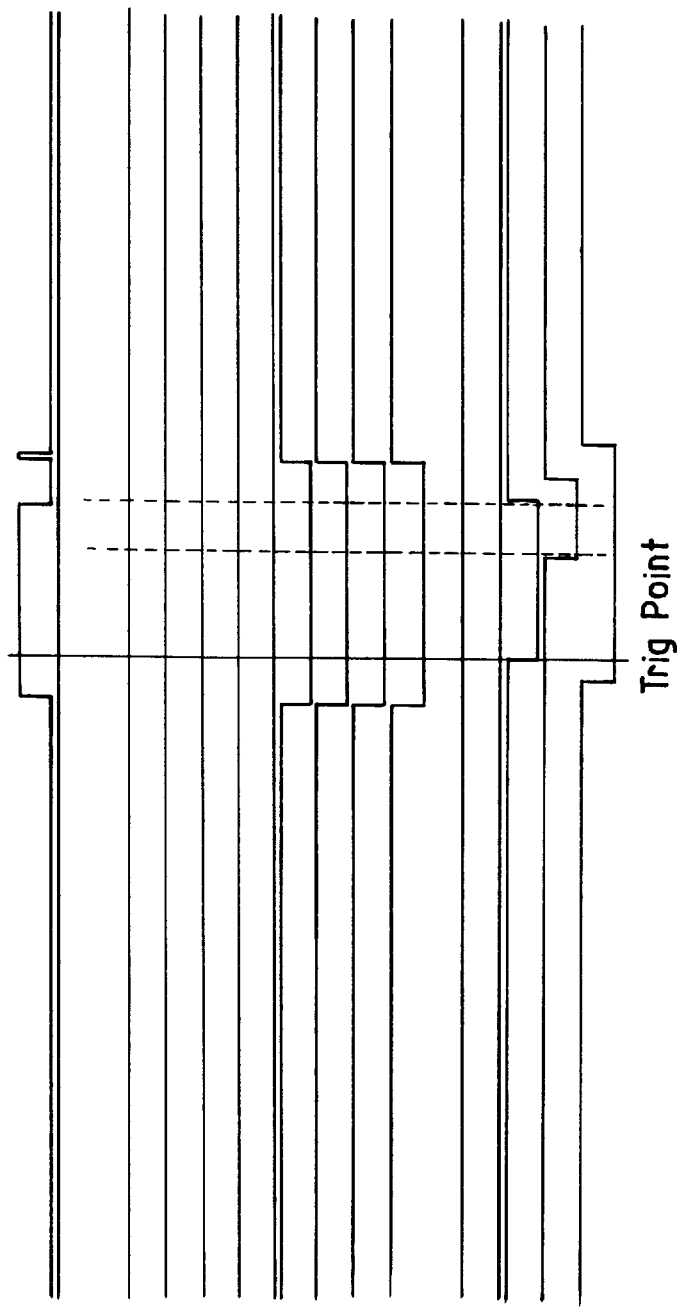
FIG. 8 is a timing diagram explaining the time relationships of the control signals RAS, CAS and WE output from the control signal generating unit with a particular address.

FIG. 8 is a timing diagram explaining the time relationships of the control signals RAS, CAS and WE output from the control signal generating unit with a particular address. In this case, the control signals are adapted to select the memory area BANK0 of the DRAM 10. This can be determined on the basis of the clocks of signals /RAS0, A24 and A25. Since all the above three clocks uniformly have a low level, it can be found, from the above description, that the selected memory area is BANK0.

The signals /RAS0, CAS3 and /WE0 are activated when they are at a low level. As shown in FIG. 8, all the clocks of these signals have a low level. The activation of the signals /RAS0, /CAS3 and /WE0 means that data is written on the portion D of the memory area BANK0.

The line drawn along the middle portion of FIG. 8 indicates the trigger point of each clock.

Figure 9:
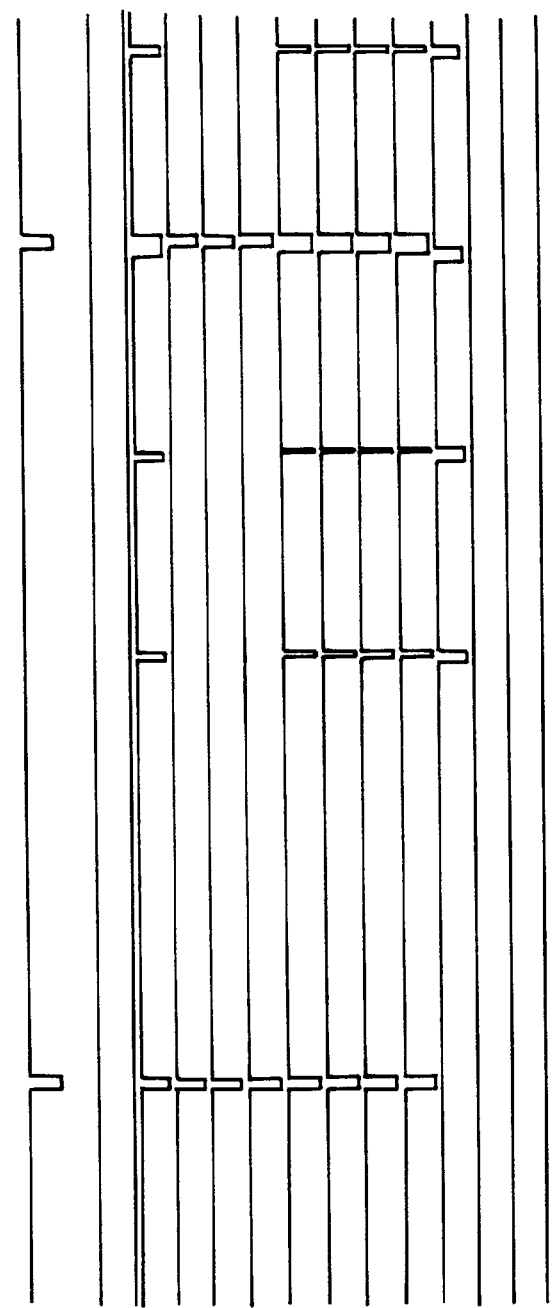
FIG. 9 is a timing diagram illustrating the refresh space of the DRAM used in accordance with the present invention.

FIG. 9 is a timing diagram illustrating the refresh space of the DRAM 10 used in accordance with the present invention. The refresh is generated at a position where each clock is dropped to its low level. All clocks have the same refresh position.

The reason why such a refresh is given is because where the RAM being used is a dynamic type RAM, its stored content may be lost unless the content is re-written at a certain interval. For preventing stored data from being lost, the data is periodically re-stored.

Figure 10:
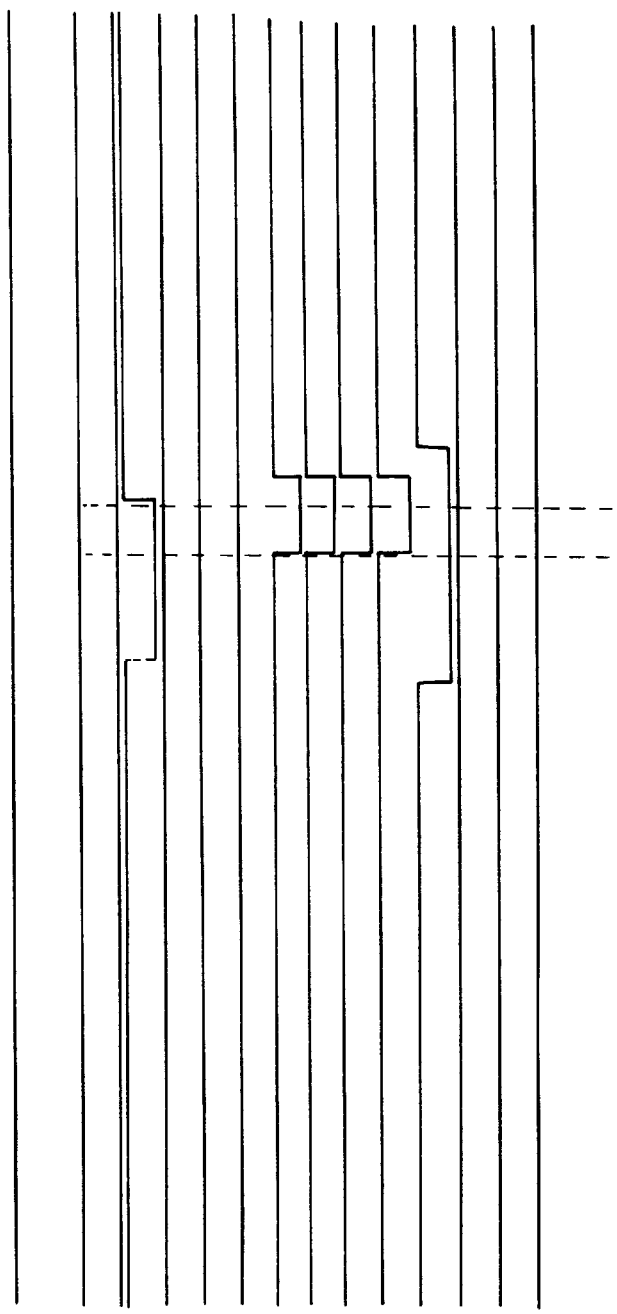
FIG. 10 is a timing diagram of signals generated upon executing an operation of writing a long word (4 bytes) on the first memory area of the DRAM in accordance with the present invention.

FIG. 10 is a timing diagram of signals generated upon executing an operation of writing a long word (4 bytes) on the memory area BANK0 of the DRAM 10. Since the memory area BANK0 is the first memory area, signals A24 and A25 are input with a low level. The signal RAS0 indicative of the defined memory area is input with a low level. Signals CAS0, CAS1, CAS2 and CAS3 respectively indicative of portions A, B, C and D of the memory area BANK0 are also input with a low level.

The signal /WE0 is also input with a low level. This means that data is written on the memory area BANK0.

Figure 11:
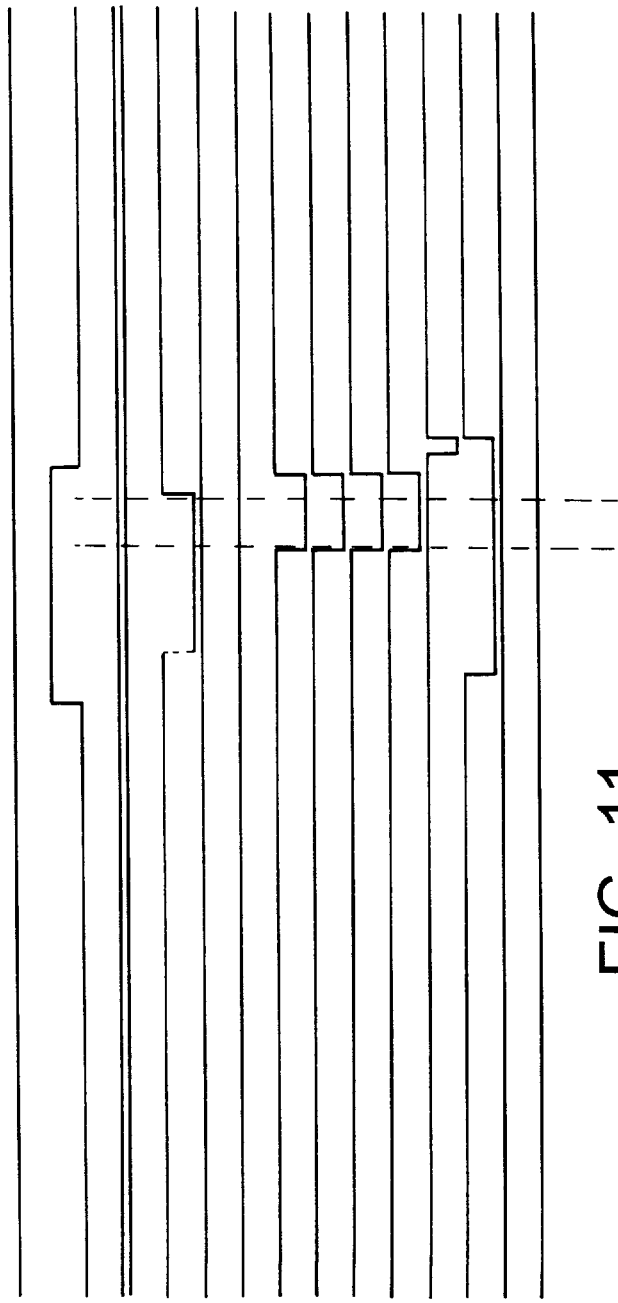
FIG. 11 is a timing diagram of signals generated upon executing an operation of writing a long word on the second memory area of the DRAM in accordance with the present invention.

FIG. 11 is a timing diagram of signals generated upon executing an operation of writing a long word on the memory area BANK1 of the DRAM 10. Since the memory area BANK1 is the second memory area, the signal A24 is input with a high clock. On the other hand, the signal A25 is input with a low level. The signal RAS1 indicative of the defined memory area is input with a low level. Signals CAS0, CAS1, CAS2 and CAS3 respectively indicative of portions A, B, C and D of the memory area BANK1 are also input with a low level.

The signal /WE1 is also input with a low level. This means that data is written on the memory area BANK1.

Figure 12:
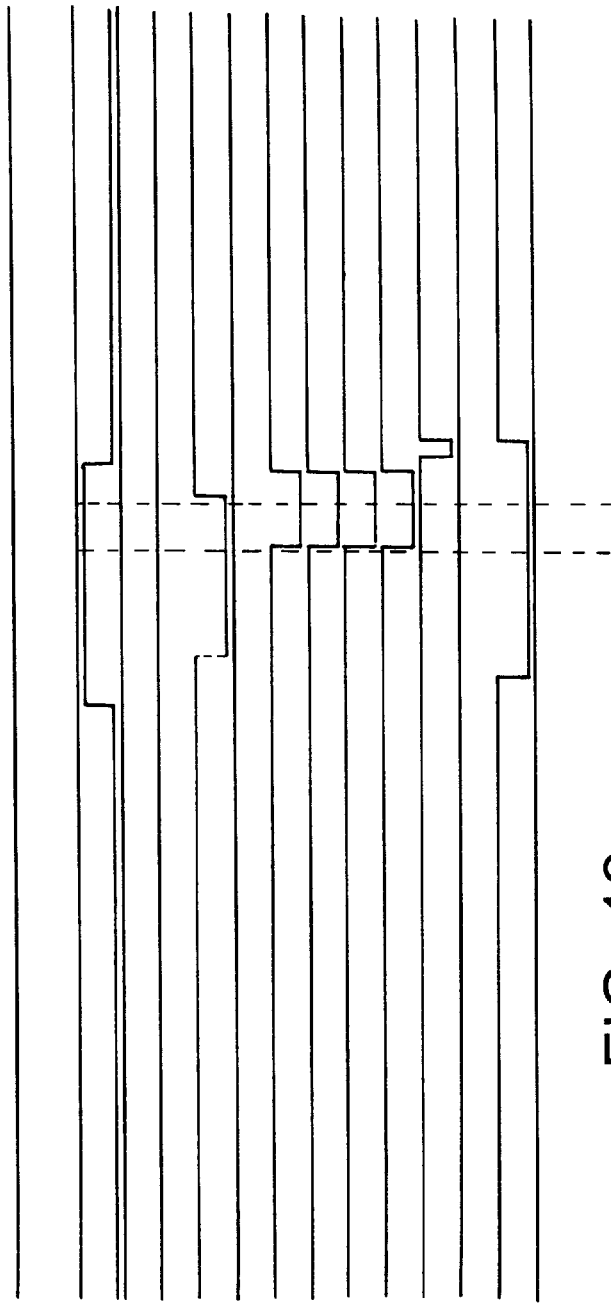
FIG. 12 is a timing diagram of signals generated upon executing an operation of writing a long word on the third memory area of the DRAM in accordance with the present invention.

FIG. 12 is a timing diagram of signals generated upon executing an operation of writing a long word on the memory area BANK2 of the DRAM 10. Since the memory area BANK2 is the third memory area, the signal A24 is input with a low level whereas the signal A25 is input with a high clock. The signal RAS2 indicative of the defined memory area is input with a low level. Signals CAS0, CAS1, CAS2 and CAS3 respectively indicative of portions A, B, C and D of the memory area BANK2 are also input with a low level.

The signal /WE2 is also input with a low level. This means that data is written on the memory area BANK2.

Figure 13:
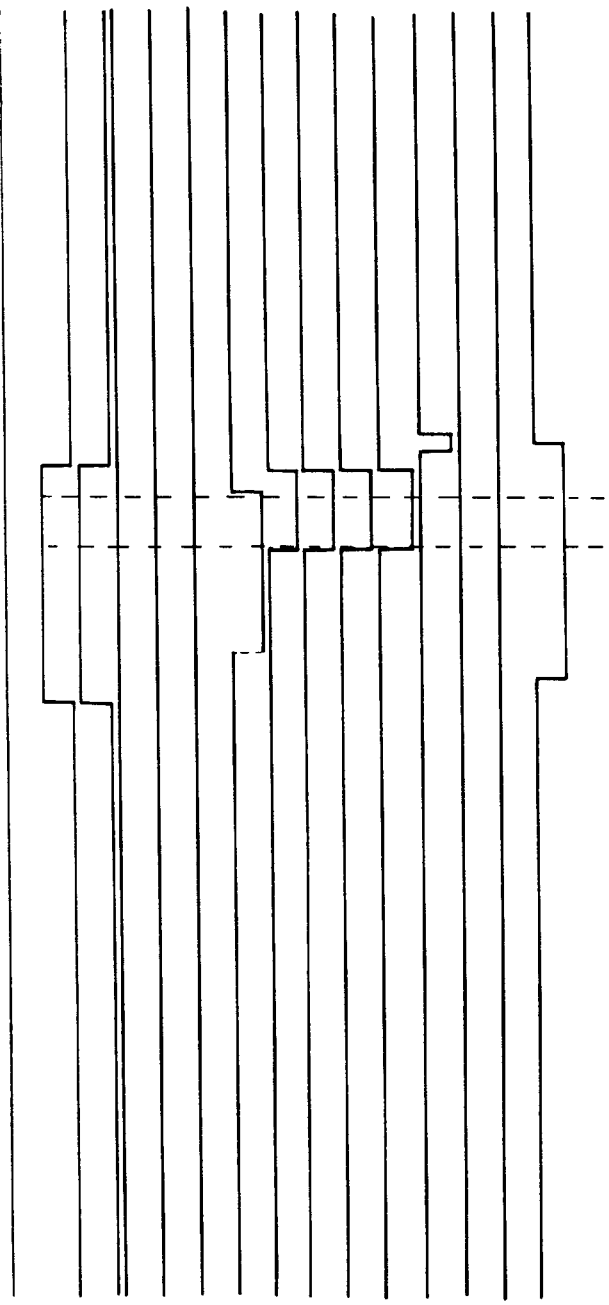
FIG. 13 is a timing diagram of signals generated upon executing an operation of writing a long word on the fourth memory area of the DRAM in accordance with the present invention.

FIG. 13 is a timing diagram of signals generated upon executing an operation of writing a long word on the memory area BANK3 of the DRAM 10. Since the memory area BANK3 is the fourth memory area, signals A24 and A25 are input with a high clock. The signal RAS3 indicative of the defined memory area is input with a low level. Signals CAS0, CAS1, CAS2 and CAS3 respectively indicative of portions A, B, C and D of the memory area BANK3 are also input with a low level.

The signal /WE3 is also input with a low level. This means that data is written on the memory area BANK3.

Figure 14:
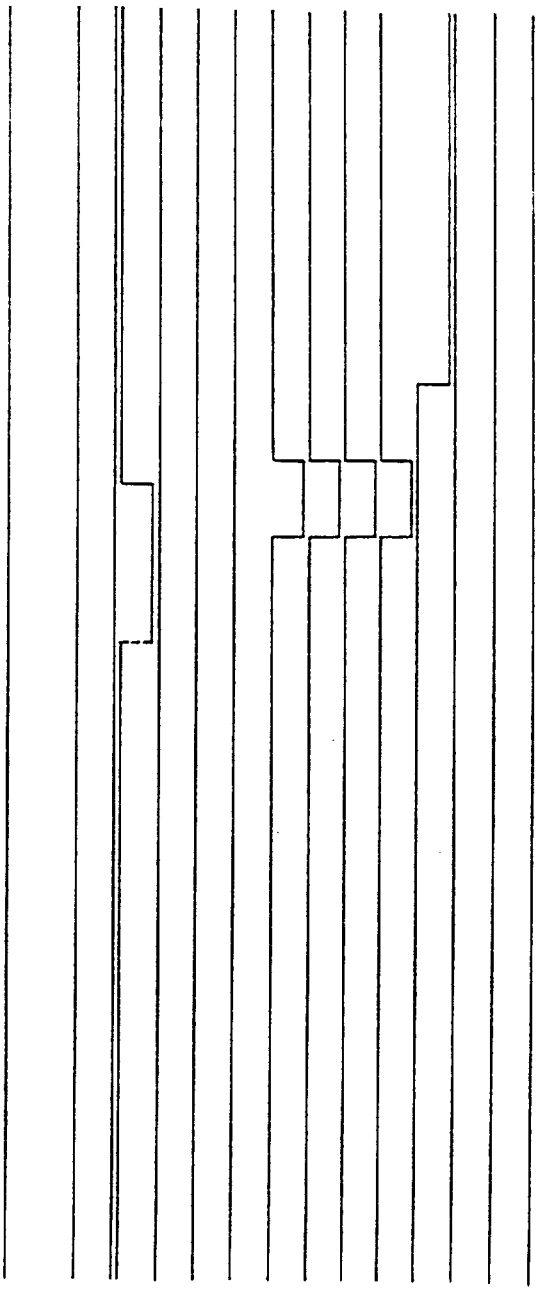
FIG. 14 is a timing diagram of signals generated upon executing an operation of reading a long word (4 bytes) stored in the first memory area of the DRAM in accordance with the present invention.

FIG. 14 is a timing diagram of signals generated upon executing an operation of reading a long word (4 bytes) stored in the memory area BANK0 of the DRAM 10. Since the memory area BANK0 is the first memory area, signals A24 and A25 are input with a low level. The signal RAS0 indicative of the defined memory area is input with a low level. Signals CAS0, CAS1, CAS2 and CAS3 respectively indicative of portions A, B, C and D of the memory area BANK0 are also input with a low level.

The signal /WE0 is also input with a high level. This means that the operation of reading data stored in the memory area BANK0 is executed.

Figure 15:
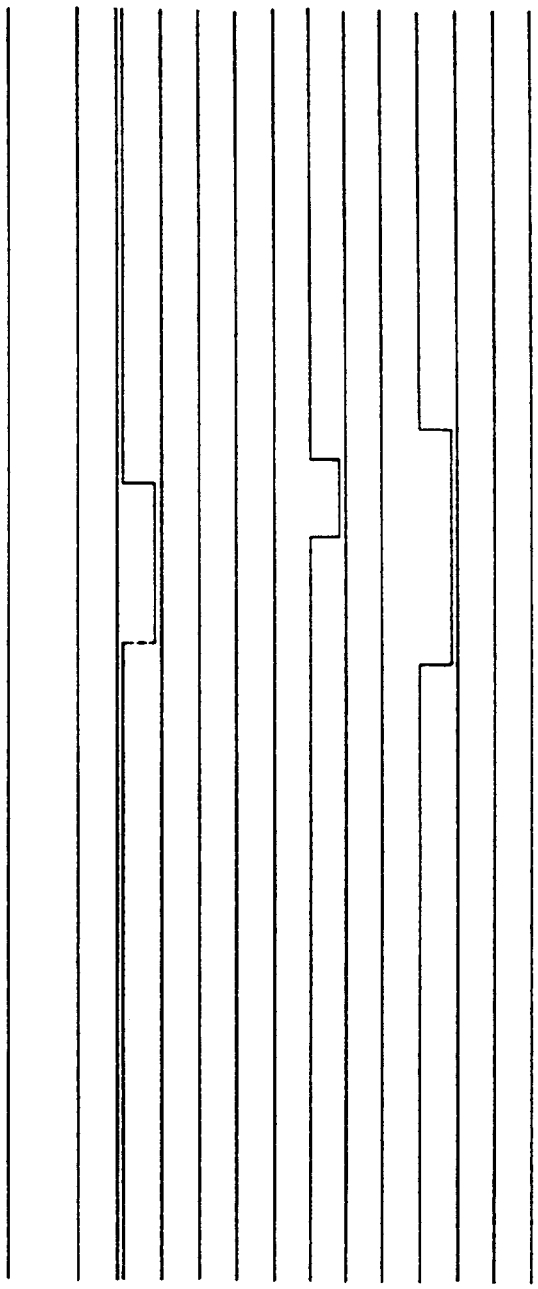
FIG. 15 is a timing diagram of signals generated upon executing a writing operation for the second portion of the first memory area divided from the DRAM in accordance with the present invention.
Figure 16:
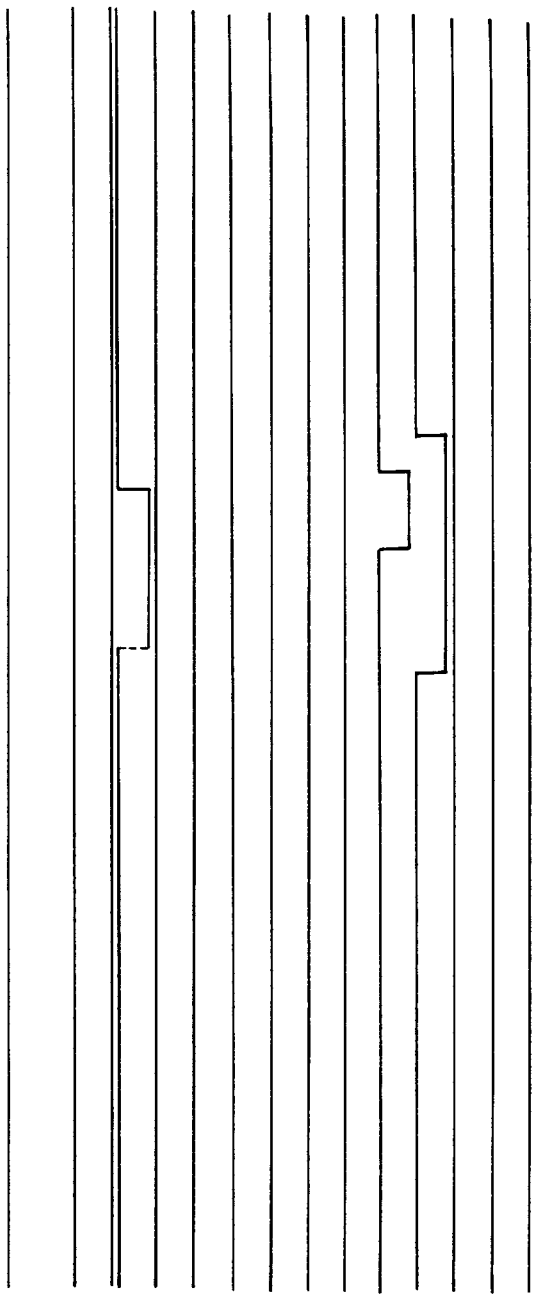
FIG. 16 is a timing diagram of signals generated upon executing a writing operation for the fourth portion of the first memory area divided from the DRAM in accordance with the present invention.

FIG. 15 is a timing diagram of signals generated upon executing a writing operation for the portion B of the memory area BANK0 divided from the DRAM 10. Since the memory area BANK0 is the first memory area, signals A24 and A25 are input with a low level. The signal RAS0 indicative of the defined memory area is input with a low level. The signal CAS1 indicative of the portion B of the memory area BANK0 are also input with a low level.

The signal /WE0 is also input with a low level. This means that data is written on the memory area BANK0.

Thus, portions of each bank are defined in accordance with corresponding CAS signals, respectively. The portions A and C of the memory area are defined in the same manner as mentioned above.

Figure 17:
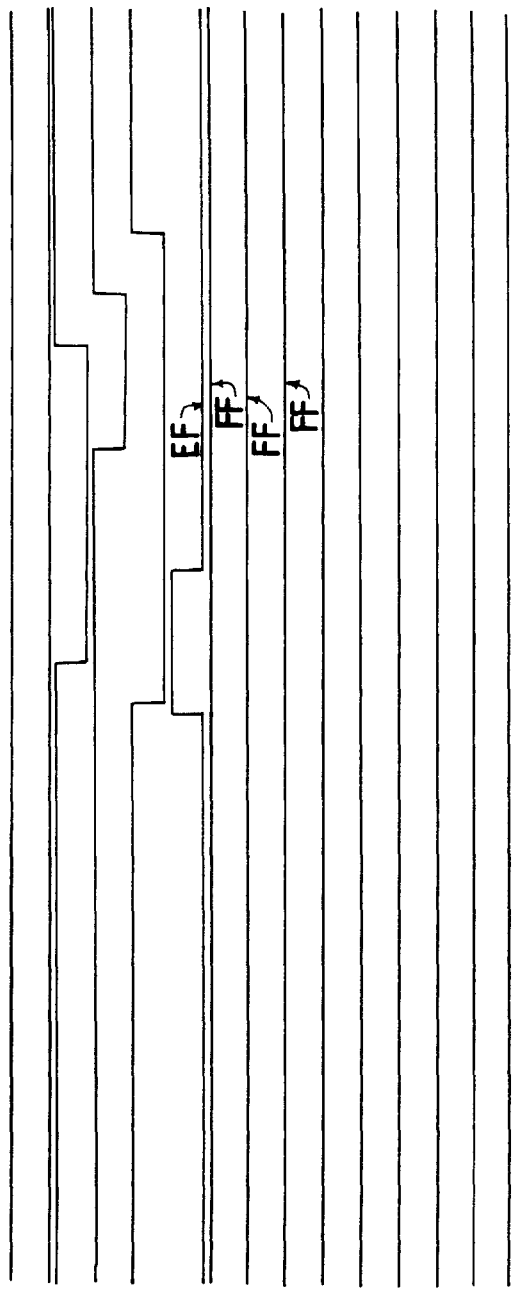
FIG. 17 is a timing diagram of signals generated upon writing data having a value of "EFFFFFFF" on a memory area along with a data bus value and parity value respectively corresponding to the data in accordance with the present invention.

FIG. 17 is a timing diagram of signals generated upon writing data on a memory area along with a data bus value and parity value respectively corresponding to the data. In this case, the value of the data to be written is "EFFFFFFF".

Referring to the timing diagram, it can be understood that the memory area on which the data is written is the first memory area BANK0 because the signals A24 and A25 are input with a low clock. The signal RAS0 indicative of the defined memory area is input with a low level. It can also be found that the signal CAS3 indicative of the portion D of the memory area BANK0 is input with a low level. The signal WE0 indicative of the execution of the writing operation is input with a low value.

In this case, signals PD0 to PD3 for writing parity data are also input. The signal PD0 has a value of "EF". This value corresponds to a binary number of "1110 1111" which has an odd value indicating that the parity value is an odd number. Accordingly, the signal is input with a low level.

The remaining signals has a value of "FF". This value corresponds to a binary number of "1111 1111" which has an even value indicating that the parity value is an even number. Accordingly, these signals are input with a high level.

Figure 18:
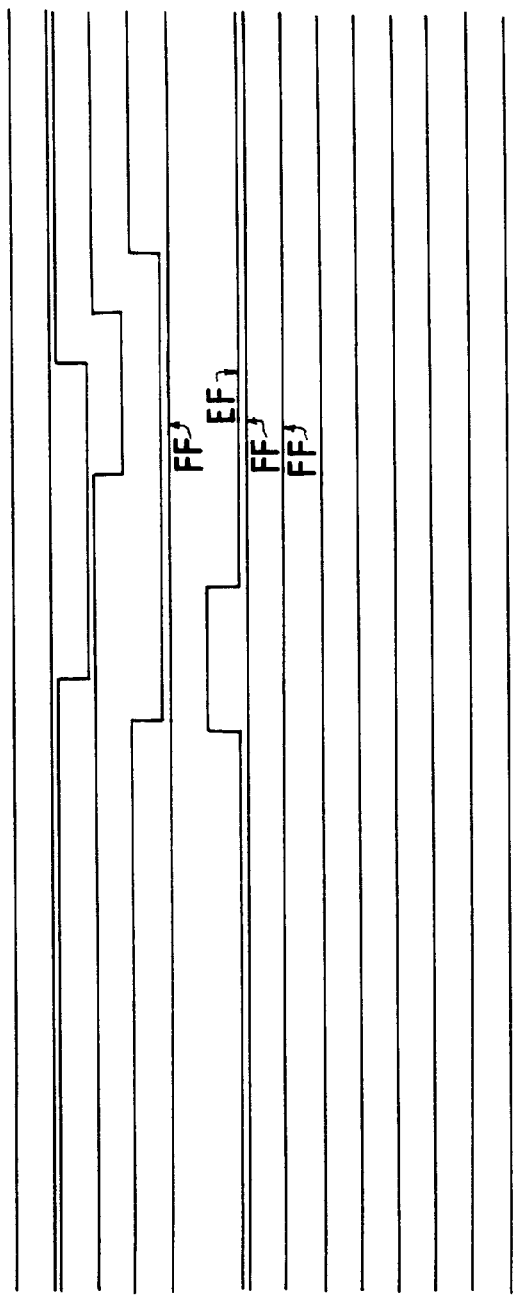
FIG. 18 is a timing diagram of signals generated upon writing data having a value of "FFEFFFFF" on a memory area along with a data bus value and parity value respectively corresponding to the data in accordance with the present invention.

FIG. 18 is a timing diagram of signals generated upon writing data having a value of "FFEFFFFF" on a memory area along with a data bus value and parity value respectively corresponding to the data.

Referring to the timing diagram, it can be understood that the memory area on which the data is written is the first memory area BANK0 because the signals A24 and A25 are input with a low clock. The signal RAS0 indicative of the defined memory area is input with a low level. It can also be found that the signal CAS3 indicative of the portion D of the memory area BANK0 is input with a low level. The signal WE0 indicative of the execution of the writing operation is input with a low value.

In this case, signals PD0 to PD3 for writing parity data are also input. The signal PD0 has a value of "FF". This value corresponds to a binary number of "1111 1111" which has an even value indicating that the parity value is an even number. Accordingly, the signal is input with a high level.

On the other hand, the signal PD1 has a value of "EF". This value corresponds to a binary number of "1110 1111" which has an odd value indicating that the parity value is an odd number. Accordingly, the signal is input with a low level.

The remaining signals has a value of "FF". This value corresponds to a binary number of "1111 1111" which has an even value indicating that the parity value is an even number. Accordingly, these signals are input with a high level.

Figure 19:
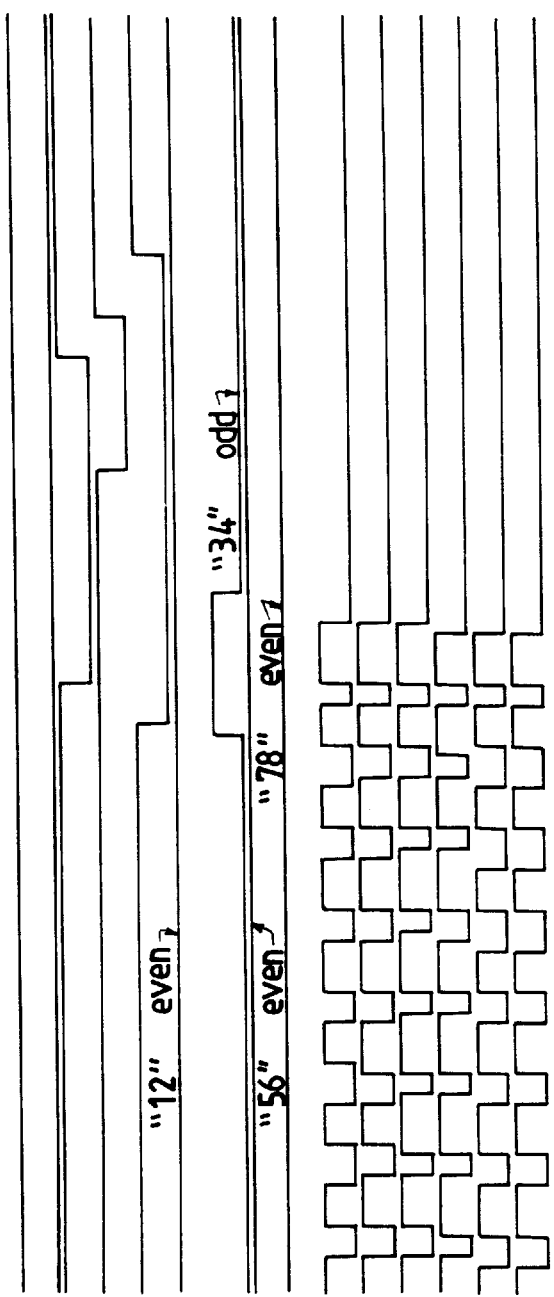
FIG. 19 is a timing diagram of signals generated upon writing data having a value of "12345678" on a memory area along with a data bus value and parity value respectively corresponding to the data in accordance with the present invention.

FIG. 19 is a timing diagram of signals generated upon writing data having a value of "12345678" on a memory area along with a data bus value and parity value respectively corresponding to the data.

Referring to the timing diagram, it can be understood that the memory area on which the data is written is the first memory area BANK0 because the signals A24 and A25 are input with a low clock. The signal RAS0 indicative of the defined memory area is input with a low level. It can also be found that the signal CAS3 indicative of the portion D of the memory area BANK0 is input with a low level. The signal WE0 indicative of the execution of the writing operation is input with a low value.

In this case, signals PD0 to PD3 for writing parity data are also input. The signal PD0 has a value of "12". This value corresponds to a binary number of "0001 0010" which has an even value indicating that the parity value is an even number. Accordingly, the signal is input with a high level. On the other hand, the signal PD1 has a value of "34". This value corresponds to a binary number of "0011 0100" which has an odd value indicating that the parity value is an odd number. Accordingly, the signal is input with a low level.

The remaining signals has values of "56" and "78". These values correspond to binary numbers of "0101 0110" and "0111 1000" each having an even value indicating that each corresponding parity value is an even number. Accordingly, these signals are input with a high level.

Figure 20:
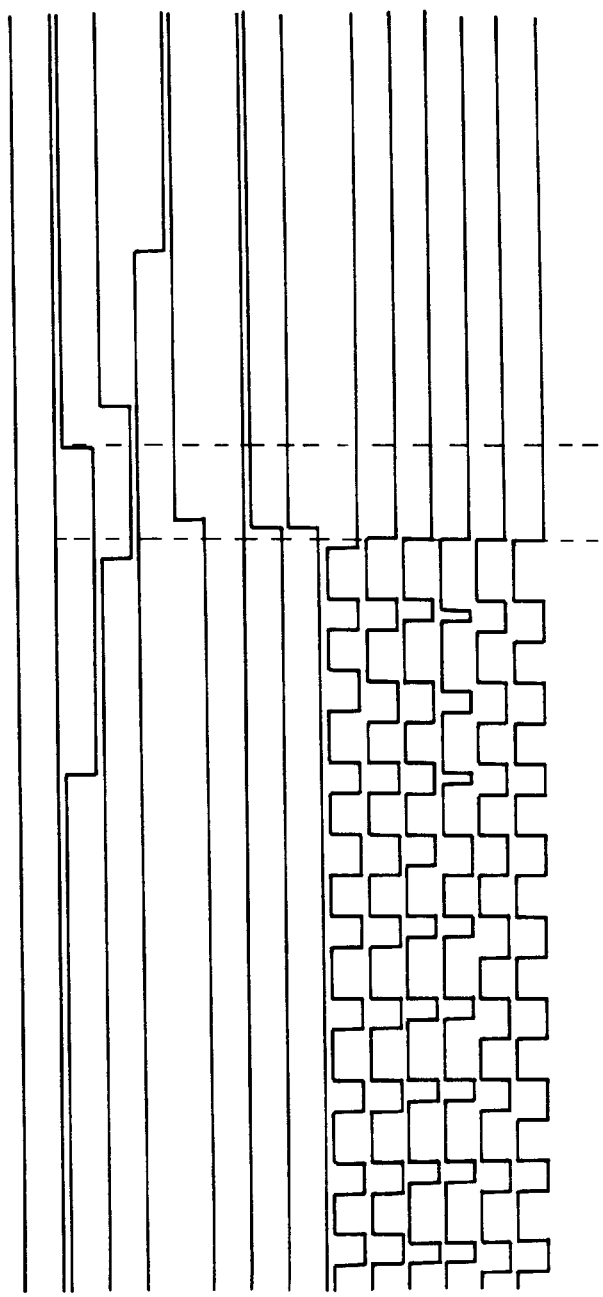
FIG. 20 is a timing diagram of signals generated upon reading the data stored in the case of FIG. 19 in accordance with the present invention.

FIG. 20 is a timing diagram of signals generated upon reading the data stored in the case of FIG. 19. The signals A24, A25, RAS0 and CAS3 indicative of the memory area BANK0, in particular, its portion D are input with a low level. Since the signal WE indicative of a writing operation is input with a high level, the data stored in the parity area of the DRAM is read. This data is used as an input signal for a circuit adapted to execute a parity test for determining whether or not the data is correct.

As apparent from the above description, the present invention eliminates waste memories involved in the conventional cases wherein the DRAM being used is divided into data and parity areas. In accordance with the present invention, the DRAM is converted from the zigzag-in-line package type to the module type. Accordingly, it is possible to eliminate the troublesomeness caused by the use of additional boards upon expanding the memory size in the conventional cases wherein the memory size is fixed to 16 M bytes. In accordance with the present invention, the memory size can be expanded to 16 M bytes with 4 M-byte banks and to 256 M bytes with 64 M-byte banks. In such a manner, the expansion of memory areas to the size supported by DRAM modules can be possible. Accordingly, the present invention supports an efficient use of memories.

As mentioned above, in accordance with the present invention, it is possible to efficiently store date without the waste of memories. In accordance with the present invention, the memory size can be expanded by a simple address modification without using any additional board. Accordingly, an economical effect is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for connecting a DRAM module to a memory management assembly included in a higher-order control system of a full electronic exchange comprising: (a) replacing a zigzag-in-line package type DRAM which is of the zigzag-in-line package type DRAM with a module type DRAM so that a parity memory is integrated with a data memory in the module type DRAM and a dedicated zigzag parity memory area becomes available for use as an integrated data and parity memory area; (b) dividing a common RAS control signal into a plurality of signals; (c) processing the plurality of signals in combination with a CAS control signal and a WE control signal for defining memory areas of the module type DRAM; and (d) determining from the Processed signals a basic address for the DRAM to utilize existing or expanded DRAM memory areas.

2. The method in accordance with claim 1, wherein the memory expansion using the basic address is obtained to a memory size that is supported by the DRAM module by simply modifying addresses in such a manner that when the memory expansion to 16 M bytes is required, an address for 4 M-byte memory areas and two addresses associated therewith are used, that when the memory expansion to 64 M bytes is required, an address for 16 M-byte memory areas and two addresses associated therewith are used, and that when the memory expansion to 256 M bytes is required, an address for 64 M-byte memory areas and two addresses associated therewith are used.

3. The method in accordance with claim 2, wherein the basic address is combined with the addresses associated therewith to define the memory areas of the DRAM in such a manner that a first memory area of the DRAM is used when both the associated address have a low level, that a second memory area of the DRAM is used when a first one of the associated addresses has a high level whereas the second associated address has a low level, that a third memory area of the DRAM is used when a first one of the associated addresses has a low level whereas the second associated address has a high level, that a fourth memory area of the DRAM is used when both the associated address have a low level.

4. The method in accordance with claim 1, wherein the definition of the memory areas of the DRAM using the divided RAS control signals is carried out in such a manner that when a first one of the RAS control signals is enabled, a first memory area of the DRAM is selected, that when a second one of the RAS control signals is enabled, a second memory area of the DRAM is selected, that when a third one of the RAS control signals is enabled, a third memory area of the DRAM is selected, that when a fourth one of the RAS control signals is enabled, a fourth memory area of the DRAM is selected, and wherein the RAS control signals are enabled at a low level.

5. The method in accordance with claim 1, wherein after one of the DRAM areas is defined by the associated RAS control signal and address signals, one of portions of the defined DRAM area is designated by an enabled one of the CAS control signals to write data thereon.

6. The method in accordance with claim 5, wherein writing and reading operations for the designated portion of the DRAM area are enabled by an enabled one of the WE control signals.

7. The method in accordance with any one of claims 3 to 6, wherein signal inputting upon writing data on a first portion of the first memory area in the DRAM is enabled when both the addresses associated with the basic address have a low level while the first one of the RAS control signals being at a low level, the first one of the CAS control signals being at a low level, and the first one of the WE control signals being at a low level, and wherein signal inputting upon writing data on respective first portions of the remaining memory areas in the DRAM is enabled in the same manner as in the case for the first memory area.

8. The method in accordance with claim 7, wherein signal inputting upon writing data on a second portion of the first memory area in the DRAM is enabled when both the addresses associated with the basic address have a low level while the first one of the RAS control signals being at a low level, the second one of the CAS control signals being at a low level, and the first one of the WE control signals being at a low level, and wherein signal inputting upon writing data on respective first portions of the remaining memory areas in the DRAM is enabled in the same manner as in the case for the first memory area.

9. The method in accordance with claim 8, wherein signal inputting upon writing data on a third portion of the first memory area in the DRAM is enabled when both the addresses associated with the basic address have a low level while the first one of the RAS control signals being at a low level, the third one of the CAS control signals being at a low level, and the first one of the WE control signals being at a low level, and wherein signal inputting upon writing data on respective first portions of the remaining memory areas in the DRAM is enabled in the same manner as in the case for the first memory area.

10. The method in accordance with claim 9, wherein signal inputting upon writing data on a fourth portion of the first memory area in the DRAM is enabled when both the addresses associated with the basic address have a low level while the first one of the RAS control signals being at a low level, the fourth one of the CAS control signals being at a low level, and the first one of the WE control signals being at a low level, and wherein signal inputting upon writing data on respective first portions of the remaining memory areas in the DRAM is enabled in the same manner as in the case for the first memory area.

11. The method in accordance with claim 1, wherein after a portion of the parity DRAM area to be written with data is designated by associated RAS, CAS and WE signals, a parity data signal corresponding to the designated parity DRAM area portion is output so that it can be written.

\* \* \* \* \*